US011109001B2

(12) United States Patent
Müller-Vogt et al.

(10) Patent No.: US 11,109,001 B2
(45) Date of Patent: Aug. 31, 2021

(54) SYSTEM AND METHOD FOR REPRESENTING A CABIN LAYOUT ON THE ORIGINAL SCALE

(71) Applicant: Airbus Operations GmbH, Hamburg (DE)

(72) Inventors: Christian Müller-Vogt, Hamburg (DE); Nick Wegner, Hamburg (DE); Dorothee Karschau, Hamburg (DE); Falk Bajorat, Hamburg (DE)

(73) Assignee: AIRBUS OPERATIONS GMBH, Hamburg (DE)

( * ) Notice: Subject to any disclaimer, the term of this patent is extended or adjusted under 35 U.S.C. 154(b) by 0 days.

(21) Appl. No.: 16/695,564

(22) Filed: Nov. 26, 2019

(65) Prior Publication Data

US 2020/0177852 A1 Jun. 4, 2020

(30) Foreign Application Priority Data

Nov. 30, 2018 (DE) .......................... 102018130569.9

(51) Int. Cl.
*H04N 9/31* (2006.01)
*B64F 5/00* (2017.01)
*G06F 30/00* (2020.01)

(52) U.S. Cl.
CPC ............ *H04N 9/3147* (2013.01); *B64F 5/00* (2013.01); *H04N 9/3185* (2013.01); *H04N 9/3194* (2013.01); *G06F 30/00* (2020.01)

(58) Field of Classification Search
CPC .. H04N 9/3147; H04N 9/3185; H04N 9/3194; B64F 5/00; G06F 30/00

(Continued)

(56) References Cited

U.S. PATENT DOCUMENTS 7,881,860 B2 * 2/2011 Noma ..................... G06F 30/15
701/117
8,401,742 B2 * 3/2013 Schliwa ................ G06Q 10/06
701/49

(Continued)

FOREIGN PATENT DOCUMENTS

DE 102007062081 A1 6/2009
DE 102009054698 A1 6/2011
EP 1684201 A2 7/2006

OTHER PUBLICATIONS

German Search Report; priority document.

*Primary Examiner* — John W Miller
*Assistant Examiner* — Sean N. Haiem
(74) *Attorney, Agent, or Firm* — Greer, Burns & Crain, Ltd.

(57) ABSTRACT

A system for representing a vehicle cabin layout on an original scale comprising a plurality of projectors, a planar projection surface and a control system. The layout is loaded as digital cabin layout data into the control system and the layout comprises a first cabin aisle section extending along a first aisle axis. The projectors comprise vertical projectors spaced along a first projector axis. The control system drives the vertical projectors and processes cabin layout data loaded into the control system to project at least one section of the cabin layout on the planar projection surface on the original scale. That section of the layout which is projected by the vertical projectors comprises the first aisle section, such that the first aisle axis runs with the first projector axis in a first aisle plane extending perpendicular to the planar projection surface.

26 Claims, 3 Drawing Sheets

(58) Field of Classification Search
 USPC .......................................................... 348/129
 See application file for complete search history.

(56) References Cited

U.S. PATENT DOCUMENTS

| | | | | |
|---|---|---|---|---|
| 8,930,088 B2* | 1/2015 | Bauer | ..................... | B64D 11/00 |
| | | | | 701/49 |
| 2006/0167630 A1* | 7/2006 | Noma | ..................... | G06F 30/15 |
| | | | | 701/117 |
| 2010/0214496 A1* | 8/2010 | Vogel | ................. | B64D 11/0015 |
| | | | | 348/744 |
| 2011/0166751 A1* | 7/2011 | Bauer | ..................... | B64D 11/00 |
| | | | | 701/49 |
| 2012/0072079 A1* | 3/2012 | Schliwa | ............. | B64D 11/0696 |
| | | | | 701/49 |
| 2014/0176735 A1* | 6/2014 | Short | ................. | H04N 1/02815 |
| | | | | 348/207.1 |
| 2015/0070319 A1* | 3/2015 | Pryor | ..................... | G06F 3/011 |
| | | | | 345/175 |
| 2016/0264243 A1* | 9/2016 | Madhav | ................ | B64D 11/003 |
| 2017/0289494 A1* | 10/2017 | Garing | ................... | G09G 3/002 |
| 2018/0029531 A1* | 2/2018 | Di Trapani | ........... | F21V 7/0008 |

* cited by examiner

SYSTEM AND METHOD FOR REPRESENTING A CABIN LAYOUT ON THE ORIGINAL SCALE

CROSS-REFERENCES TO RELATED APPLICATIONS

This application claims the benefit of the German patent application No. 102018130569.9 filed on Nov. 30, 2018, the entire disclosures of which are incorporated herein by way of reference.

FIELD OF THE INVENTION

The present invention relates to a system and a method for representing a layout of a vehicle cabin, in particular an aircraft cabin, on the original scale.

BACKGROUND OF THE INVENTION

Before the initial production of vehicle cabins, such as aircraft cabins, for example, models of these vehicle cabins on the original scale are often produced first, in order that customer and manufacturer can obtain a real impression of the cabin before the latter is finally produced. In addition, the model can also be used to check whether, for example, trollies or wheelchairs can be moved through the cabin without any problems.

Producing models on the original scale is time-consuming and costly in terms of materials. Therefore, it is likewise known to mark on the original scale only the contours of the layout of the vehicle cabin such as, for example, the contours of rows of seats, of aisle sections or else of monuments such as, for example, kitchens or galleys and toilets on a presentation surface. In order to reinforce the spatial impressions, volume elements, for example composed of cardboard or plywood, the dimensions of which correspond approximately to those of a monument or a seat, can be positioned on the presentation surfaces. Additionally or alternatively, vehicle seats can also be arranged on the original scale along the depicted rows of seats.

In order to simplify the application of the contours of the layout and the arrangement of the volume elements, the outer boundaries of the vehicle cabin and other, non-displaceable boundaries can be permanently predefined on the presentation surface. For this purpose, by way of example, a film with the outer boundaries can be adhesively bonded onto the presentation surface. The outer boundaries and possibly other, permanently applied markings that predefine doors or windows, for example, serve for orientation during the application of the contours of the layout and the arrangement of the volume elements. The exact positioning is carried out by the dimensions being gathered from specification data for the cabin and being transferred to the presentation surface by manual measurement. Depending on the complexity of the layout of the vehicle cabin, the application of the contours of the layout and the arrangement of the volume elements take from a few hours to a few days.

SUMMARY OF THE INVENTION

Against this background, it is an object of the present invention to specify a system and a method which can help to significantly reduce the time required to transfer the layout of a vehicle cabin or at least the contours of the layout to a presentation surface and to arrange volume elements on the presentation surface.

In a first aspect, an object on which the invention is based is achieved by means of a system for representing a layout of a vehicle cabin on the original scale. The system comprises a plurality of projectors, a planar projection surface and a control system. The layout to be represented can be loaded in the form of digital cabin layout data into the control system. The layout to be represented comprises at least one first aisle section which corresponds to a passage area for persons in the vehicle cabin and which extends along a first aisle axis. The plurality of projectors comprises at least one first group of vertical projectors which are arranged at a distance from one another along a first projector axis. The control system is configured to drive the plurality of projectors and to process cabin layout data loaded into the control system such that the layout of the vehicle cabin is projected on the planar projection surface on the original scale and at least one section of the layout of the vehicle cabin is projected onto the planar projection surface by the first groups of vertical projectors, wherein that section of the layout which is projected by the first group of vertical projectors comprises the first aisle section and the first aisle section is projected such that the first aisle axis runs with the first projector axis in a first aisle plane, wherein the first aisle plane extends perpendicular to the planar projection surface.

In other words, the system according to the invention comprises three essential components: a planar projection surface, a plurality of projectors and a control system. Added to this is the layout of the vehicle cabin that is loaded into the control system in the form of digital data during the operation of the system.

The layout of the vehicle cabin, also referred to as cabin layout, is represented on the planar projection surface by the projectors of the system. In this case, the representation of the layout or the projection of the layout onto the projection surface is understood to mean at least the imaging of contours of the cabin arrangement. The contours can comprise for example the contours of seats, aisles and elements of kitchens or galleys and partition walls. These contours are represented on the original scale, i.e., the dimensions of the layout of the vehicle cabin that is represented on the projection surface correspond to the actual dimensions of the vehicle cabin when the latter is produced.

The projectors are preferably computer-controlled digital projectors which are connected to the control system and are controlled by the latter. The control of the projectors concerns at least the provision of image data to the projectors, which then project the data onto the projection surface. In addition, the control of the projectors can also include varying the optical system, for example for correcting projection aberrations or adapting the magnification of the optical system.

The projectors comprise at least one first group of vertical projectors. The vertical projectors are arranged at a distance from one another along a first projector axis. The first group of vertical projectors comprises at least two, but preferably more than two projectors. By way of example, the first group of vertical projectors can comprise eight projectors. The number of vertical projectors is chosen such that that region of the projection surface which is to be illuminated by the vertical projectors, i.e., that region of the projection surface onto which the vertical projectors project the layout of the vehicle cabin, is illuminated uniformly. The vertical projectors are referred to as vertical projectors since their central projection axis extends in each case perpendicular to the planar projection surface.

The layout of the vehicle cabin as claimed is present in the form of digital cabin layout data that are loaded into the control system. These data are preferably specification data that are also used during the production of the cabin. By way of example, they can be CAD data. Alternatively, however, it is also possible to load the cabin layout data into the control system in the form of graphics files. This reduces the complexity required if the control system processes the cabin layout data.

The layout to be represented of the vehicle cabin comprises at least one first aisle section. In the vehicle cabin produced, by way of example, passengers, crew members, wheelchairs or trollies move on the first aisle section. The aisle section extends along a first aisle axis running in the center of the aisle, for example.

The layout to be represented, and, in particular, the finally projected layout, need not comprise a complete vehicle cabin. Rather, it is also possible and expressly provided thus to represent only a section of the vehicle cabin on the projection surface. By way of example, a section of an aircraft cabin which comprises, besides a galley, the adjacent region of the passenger cabin can be represented.

Finally, the system comprises the control system, which processes the cabin layout data and controls the projectors. In this case, the control system can consist of one or a plurality of components. By way of example, the control system can comprise a control computer and one or a plurality of devices enabling an operator to operate the control computer.

The control system processes the cabin layout data and drives the projectors such that the layout of the vehicle cabin or at least the projected section of the layout is projected onto the projection surface on the original scale. In this case, the first aisle section of the layout is projected onto the planar projection surface by the first group of vertical projectors. Specifically, the projection is carried out such that the first aisle axis of the projected first aisle section extends in an aisle plane with the first projector axis. In other words, the vertical projectors of the first group are arranged perpendicularly above the first aisle section.

The system according to the invention advantageously reduces significantly the time and the effort required to represent the layout of a vehicle cabin in the original size since nothing has to be measured manually and no markings whatsoever have to be applied by hand. Moreover, it is no longer necessary for the basic dimensions of the cabin to be applied permanently on the projection surface, since these dimensions are also projected. This reduces the costs for the maintenance of the projection surface, since the films with the cabin contours regularly have to be renewed owing to wear.

Furthermore, the system as claimed has the advantage that the projection of the layout of the vehicle cabin is carried out substantially without shadows. Persons move on the projected layout generally along the first aisle section. Since the vertical projectors are arranged perpendicularly above the first aisle section and illuminate the area directly underneath, i.e., project the layout onto this area, the casting of shadows by persons is minimized provided that these persons move along the aisle section.

The arrangement of the projectors of the system relative to the projection surface is dependent on the layout of the vehicle cabin that is intended to be represented by means of the system, even if the cabin layout data are not constantly loaded into the system. Otherwise the shadow-free projection and the projection on the original scale could not be ensured.

In one preferred embodiment, the layout to be represented comprises a second aisle section, which corresponds to a second passage area for persons in the vehicle cabin and which extends along a second aisle axis. The plurality of projectors comprises a second group of vertical projectors which are arranged at a distance from one another along a second projector axis, wherein the first projector axis runs parallel or perpendicular to the second projector axis, for example. The control system is configured to drive the plurality of projectors and to process the cabin layout data loaded into the control system such that at least one section of the layout of the vehicle cabin is projected onto the planar projection surface by the second groups of vertical projectors, wherein that section of the layout which is projected by the second group of vertical projectors comprises the second aisle section and the second aisle section is projected such that the second aisle axis runs with the second projector axis in a second aisle plane, wherein the second aisle plane extends perpendicular to the planar projection surface.

The preferred embodiment thus makes it possible to project a cabin layout having two aisle sections onto the projection surface, that is to say for example a section of a cabin layout of a twin-aisle or wide-bodied aircraft. The second group of vertical projectors, which are advantageously arranged directly above the second aisle section, provides for the second section to be projected with no shadows or at least with few shadows, even if persons move on the second aisle section.

In the preferred embodiment, it becomes particularly clear that the arrangements of the projectors and of the planar projection surface is not arbitrary, but rather is dependent on the cabin layout to be represented, even if the cabin layout data should not be permanently loaded into the system. Since the vertical projectors of the first and second groups have to be arranged in each case in a plane with the aisle sections situated underneath, the arrangements of the projectors have to be coordinated with the layout to be represented.

It is further preferred if the distance between at least two vertical projectors was chosen such that regions of the planar projection surface which are illuminated by projectors arranged adjacent to one another overlap in sections in one or a plurality of overlap regions, such that in the one or the plurality of overlap regions the layout of the vehicle cabin is projected onto the planar projection surface simultaneously by two or more projectors. The control system is configured to drive the vertical projectors such that a body situated in the overlap region casts the smallest possible shadow. In a particularly advantageous manner, the projection in the overlap regions is thus substantially free of shadows, since for example a person moving in the overlap regions is illuminated from two sides, directly opposite sides in the case of vertical projectors and a movement on the aisle section, with the result that no casting of shadows occurs, even if the person is not situated directly beneath a vertical projector.

The control system is preferably configured to drive the vertical projectors such that a brightness of the layout of the vehicle cabin that is projected onto the projection surface in the one or the plurality of overlap regions corresponds to a brightness of the layout of the vehicle cabin that is projected onto the projection surface in regions in which the layout of the vehicle cabin is projected onto the planar projection surface only by one projector. A uniform illumination of the projection surface is thus advantageously achieved.

In a further embodiment, the control system is configured to drive the vertical projectors such that independently of the projection of the layout of the vehicle cabin, a cabin boundary is projected onto the planar projection surface on the original scale. The cabin boundary is generated by the control system not from the cabin layout data loaded into the control system. The cabin boundary is projected onto the planar projection surface at the same time as the layout of the vehicle cabin, and from the superimposition of the projected cabin boundary and the projected layout of the vehicle cabin it is possible to ascertain whether the cabin layout is projected onto the planar projection surface on the original scale.

In the preferred embodiment, in the control system, the contours of the vehicle cabin, i.e., the cabin boundary, are stored permanently and independently of the cabin layout data to be represented. The cabin boundary is represented independently of the cabin layout. It is calibrated once for known optical settings of the projectors, i.e., the fact that the cabin boundary is represented on the original scale is established and ensured once by means of measurements. Afterward, in a simple manner, for example by means of an optical comparison of the cabin boundary with the projected boundary of the represented cabin layout by an operator, it can be ensured that the layout of the vehicle cabin is represented on the original scale.

Furthermore, it is preferred if the system comprises a plurality of volume elements which have been arranged on the planar projection surface on the basis of the projected layout of the vehicle cabin. The volume elements can be arranged on the projection surface in a particularly simple manner by means of the projected layout since the positions of the volume elements do not have to be determined manually.

In a further preferred embodiment, the system comprises at least one camera which is connected to the control system and which is configured to capture, at least in sections, the planar projection surface with the layout of the vehicle cabin projected thereon. The control system is further configured to determine deviations between the layout of the vehicle cabin that is projected onto the planar projection surface and is captured by the camera and cabin layout data loaded into the control system and, on the basis of the deviations determined previously, to alter driving of the plurality of projectors and/or processing of the cabin layout data loaded into the control system such that deviations between the layout of the vehicle cabin that is projected onto the planar projection surface and is captured by the camera and the cabin layout data loaded into the control system are minimized.

In other words, the system in the preferred embodiment comprises one or preferably a plurality of cameras. The camera or the cameras capture(s) the cabin layout projected onto the planar projection surface, create(s) a digital image of the layout and compare(s) the captured layout with the representation that was provided by the control system. In this regard, by way of example, errors in the transition between two projectors, different brightnesses or distortions can be automatically corrected. In the case of fixed arrangements of the cameras and an unchanged optical system, it is also possible to check whether the representation is effected on the original scale.

In one preferred embodiment in which the independent cabin boundary is projected and the system comprises the at least one camera which is connected to the control system and which is configured to capture, at least in sections, the planar projection surface with the layout of the vehicle cabin projected thereon and the cabin boundary projected thereon, the control system is configured to determine deviations between the layout of the vehicle cabin that is projected onto the planar projection surface and is captured by the camera and the cabin boundary that is projected onto the planar projection surface and is captured by the camera and, on the basis of the deviations determined previously, to alter driving of the plurality of projectors and/or processing of the cabin layout data loaded into the control system such that deviations between the layout of the vehicle cabin that is projected onto the planar projection surface and is captured by the camera and the cabin boundary that is projected onto the planar projection surface and is captured by the camera are minimized.

The preferred embodiment makes it possible, in a simple manner, by means of the automated comparison of the cabin boundary with the projected cabin layout, to check whether the representation of the cabin layout corresponds to the original scale, since it is known that the cabin boundary is represented on the original scale.

In one exemplary embodiment, the planar projection surface is formed by a commercially available covering on which observers of the layout of the vehicle cabin that is projected onto the planar projection surface can pass. This commercially available floor covering, e.g., a carpet, or the projection surface generally can be dark-colored, for example, such that the layout of the vehicle cabin is projected onto the projection surface in bright colors. Alternatively, it is also possible to project the layout of the vehicle cabin as a negative onto the projection surface. In the case of an exemplary dark projection surface, therefore, only the parts of the projection surface in which no contours are intended to be represented are illuminated. The control system would be correspondingly adapted in each case for this purpose.

It is furthermore preferred for the control system to be configured to project two or more different layouts of vehicle cabins simultaneously onto the projection surface. The control system is furthermore preferably configured to project the different layouts of vehicle cabins onto the planar projection surface in different colors and/or to project the different layouts of vehicle cabins onto the planar projection surface with different, adjustable brightnesses. A direct comparison of the layouts of two different vehicle cabins can thus be performed.

The cabin layout data are preferably specification data used for producing the vehicle cabin. In this embodiment, the control system is configured to process the specification data in order to generate a representation of the layout of the vehicle cabin that is projected onto the planar projection surface.

In one preferred embodiment, the control system comprises a manipulation unit, by means of which a user can alter the representation of the layout of the vehicle cabin that is projected onto the planar projection surface at the same time, wherein the control system is configured to drive the plurality of projectors such that the altered representation is projected onto the planar projection surface. By means of the manipulation unit, an operator of the system can advantageously alter the representation of the layout during projection, such that advantageously different configurations of the layout can be directly visualized and compared with one another.

If the system additionally comprises a manipulation unit, the control system is preferably furthermore configured to translate the representation of the layout of the vehicle cabin that has been altered by means of the manipulation unit into altered specification data, wherein the altered specification data can be used for producing a vehicle cabin. In this way, the planning and production process can be significantly simplified since already visualized changes can be taken over directly into the production process. Handover to a planning department, which revises the layout, which then has to undergo acceptance once again, can be obviated in this way.

In one exemplary, preferred embodiment, the plurality of projectors comprises at least one horizontal projector which is provided for projecting sections of the layout of the vehicle cabin which are projected onto at least one inclined projection surface arranged in a manner not parallel to the planar projection surface. The control system is configured to drive the at least one horizontal projector and to process the cabin layout data loaded into the control system such that the layout of the vehicle cabin is represented on the at least one inclined projection surface on the original scale.

By way of example a horizontal projector can project vertical sections of the layout of the vehicle cabin onto two- or three-dimensional volume elements in order to give a more realistic impression of the cabin. By way of example, signs, logos and inscriptions can be projected onto partition walls.

The at least one horizontal projector is preferably arranged in a manner inclined with respect to the vertical projectors. By way of example, the horizontal projector or the horizontal projectors can be suspended in a plane with the vertical projectors, but in contrast to the latter can be directed so as not to be perpendicular to the planar projection surface, but rather can be inclined at an angle of less than 90°, preferably less than 60°, with respect to the planar projection surface.

In a second aspect, the invention relates to a method for representing a layout of a vehicle cabin on the original scale on a planar projection surface with a plurality of projectors, wherein the layout to be represented is loaded into the control system in the form of digital cabin layout data and the layout to be represented comprises at least one first aisle section which corresponds to a passage area for persons in the vehicle cabin and which extends along a first aisle axis, wherein the plurality of projectors comprises at least one first group of vertical projectors which are arranged at a distance from one another along a first projector axis, and wherein the plurality of projectors is driven by a control system and the cabin layout data loaded into the control system are processed such that the layout of the vehicle cabin is projected on the planar projection surface on the original scale and at least one section of the layout of the vehicle cabin is projected onto the planar projection surface by the first groups of vertical projectors, wherein that section of the layout which is projected by the first group of vertical projectors comprises the first aisle section and the first aisle section is projected such that the first aisle axis runs with the first projector axis in a first aisle plane, wherein the first aisle plane extends perpendicular to the planar projection surface.

In one preferred embodiment of the method, the layout to be represented comprises a second aisle section, which corresponds to a second passage area for persons in the vehicle cabin and which extends along the second aisle axis, wherein the plurality of projectors comprises a second group of vertical projectors which are arranged at a distance from one another along a second projector axis, wherein the first projector axis runs parallel to the second projector axis, and wherein the plurality of projectors is driven by the control system and the cabin layout data loaded into the control system are processed such that at least one section of the layout of the vehicle cabin is projected onto the planar projection surface by the second groups of vertical projectors, wherein that section of the layout which is projected by the second group of vertical projectors comprises the second aisle section and the second aisle section is projected such that the second aisle axis runs with the second projector axis in a second aisle plane, wherein the second aisle plane extends perpendicular to the planar projection surface.

In one preferred embodiment of the method, the distance between at least two vertical projectors is was chosen such that regions of the planar projection surface which are illuminated by projectors arranged adjacent to one another overlap in sections in one or a plurality of overlap regions, such that in the one or the plurality of overlap regions the layout of the vehicle cabin is projected onto the planar projection surface simultaneously by two or more projectors, wherein the control system drives the vertical projectors such that a body situated in the overlap region casts the smallest possible shadow, and/or such that a brightness of the layout of the vehicle cabin that is projected onto the projection surface in the one or the plurality of overlap regions corresponds to a brightness of the layout of the vehicle cabin that is projected onto the projection surface in regions in which the layout of the vehicle cabin is projected onto the planar projection surface only by one projector.

Preferably, the control system drives the vertical projectors such that independently of the projection of the layout of the vehicle cabin, a cabin boundary is projected onto the planar projection surface on the original scale, wherein the cabin boundary is generated by the control system not from the cabin layout data loaded into the control system, wherein the cabin boundary is projected onto the planar projection surface in parallel with the layout of the vehicle cabin, and wherein from the superimposition of the projected cabin boundary and the projected layout of the vehicle cabin it is possible to ascertain whether the cabin layout is projected onto the planar projection surface on the original scale.

It is furthermore preferred, for example, for a plurality of volume elements to be arranged on the planar projection surface on the basis of the projected layout of the vehicle cabin.

In a further preferred embodiment, one or a plurality of cameras connected to the control system capture(s), at least in sections, the planar projection surface with the layout of the vehicle cabin projected thereon, and wherein the control system determines deviations between the layout of the vehicle cabin that is projected onto the planar projection surface and is captured by the one or the plurality of cameras and the cabin layout data loaded into the control system and, on the basis of the deviations determined previously, alters driving of the plurality of projectors and/or processing of the cabin layout data loaded into the control system such that deviations between the layout of the vehicle cabin that is projected onto the planar projection surface and is captured by the one or the plurality of cameras and the cabin layout data loaded into the control system are minimized.

In one preferred embodiment, the camera connected to the control system captures, at least in sections, the planar projection surface with the layout of the vehicle cabin projected thereon and the cabin boundary projected thereon, wherein the control system determines deviations between the layout of the vehicle cabin that is projected onto the planar projection surface and is captured by the camera and the cabin boundary that is projected onto the planar projection surface and is captured by the camera and, on the basis of determined deviations, alters driving of the plurality of projectors and/or processing of the cabin layout data loaded into the control system such that deviations between the layout of the vehicle cabin that is projected onto the planar projection surface and is captured by the camera and the cabin boundary that is projected onto the planar projection surface and is captured by the camera are minimized.

It is furthermore preferred if the control system projects two different layouts of vehicle cabins simultaneously onto the projection surface, wherein the control system to project the different layouts of vehicle cabins onto the planar projection surface in different colors and/or to project the different layouts of vehicle cabins onto the planar projection surface with different, adjustable brightnesses.

The cabin layout data loaded into the control system are for example specification data used for producing the vehicle cabin, and wherein the control system processes the specification data in order to generate a representation of the layout of the vehicle cabin that is projected onto the planar projection surface.

In one preferred embodiment, by means of a manipulation unit, a user can alter the representation of a layout of the vehicle cabin that is projected onto the planar projection surface at the same time. In this case, the control system drives the plurality of projectors such that the altered representation is projected onto the planar projection surface. Preferably, the control system translates the representation of the cabin layout that has been altered by means of the manipulation unit into altered specification data, which can be used for producing a vehicle cabin.

The plurality of projectors preferably comprises at least one horizontal projector which is provided for projecting sections of the layout of the vehicle cabin which are projected onto at least one inclined projection surface arranged in a manner not parallel to the planar projection surface, wherein the control system drives the at least one horizontal projector and processes the cabin layout data loaded into the control system such that the layout of the vehicle cabin is represented on the at least one inclined projection surface on the original scale.

The advantages of the various preferred and exemplary embodiments of the method correspond to the respective advantages of the preferred and exemplary embodiments of the system, which have device features corresponding to the respective method features.

BRIEF DESCRIPTION OF THE DRAWINGS

Exemplary embodiments of a system according to the invention and of a method according to the invention are described in greater detail below with reference to the drawings. The individual steps of the method are explained in association with the respective elements of the system. A separate description of the method has been omitted since the method steps are generally linked directly to the corresponding device features. In this case.

In the following description of the figures, in the different figures elements that correspond to one another are designated by the same reference signs, provided that nothing to the contrary is mentioned in the description of the figures.

DETAILED DESCRIPTION OF THE PREFERRED EMBODIMENTS

Figure 1:
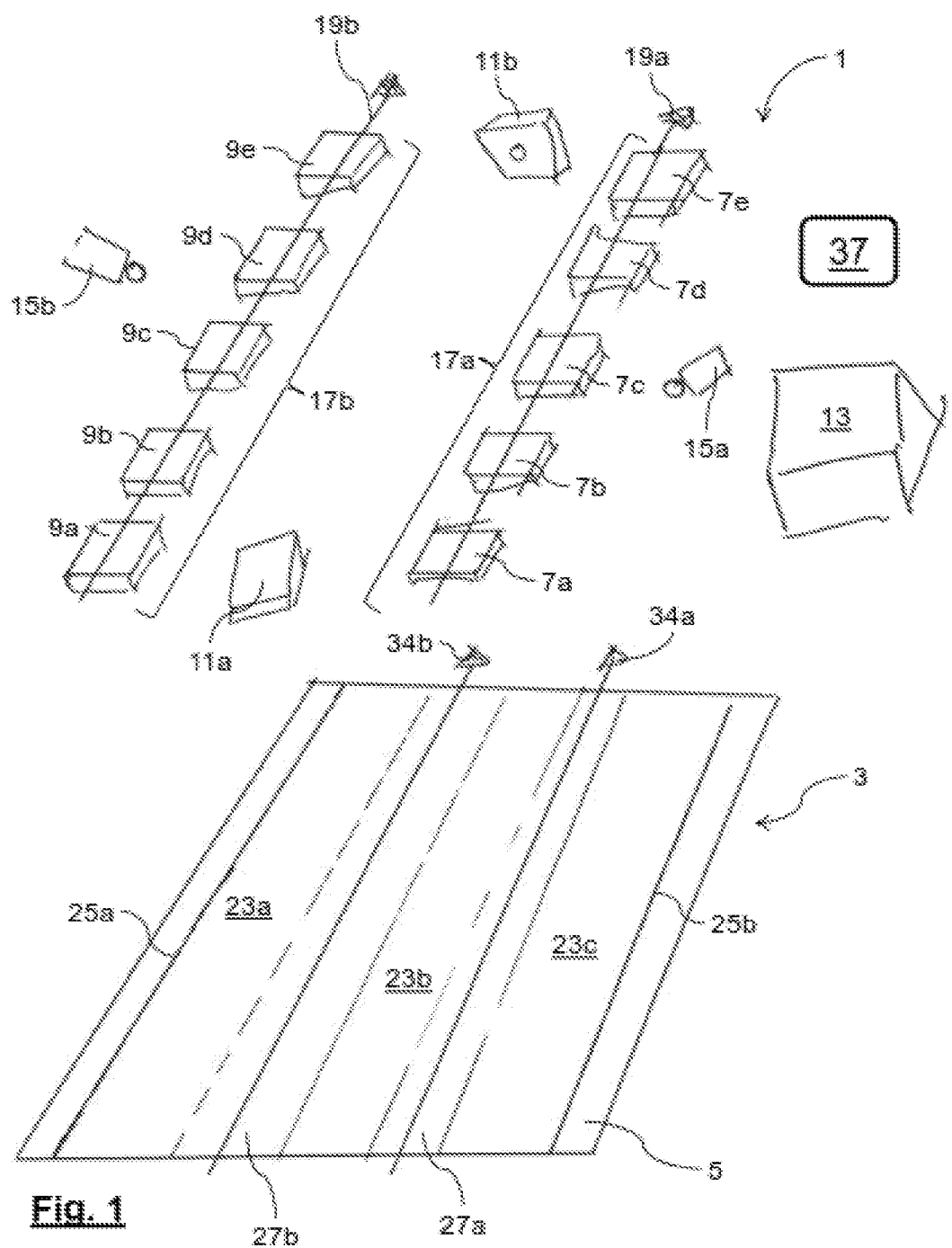
FIG. 1 shows one exemplary embodiment of a system.

Referring to FIG. 1, a first exemplary embodiment of a system 1 for representing a layout 3 of a vehicle cabin on a planar projection surface 5 on the original scale is described first. The system 1 comprises, besides the projection surface 5, a plurality of projectors 7a-7e, 9a-9e, 11a, 11b, a control system 13 and two cameras 15a, 15b. The projectors 7a-7e, 9a-9e, 11a, 11b and the cameras 15a, 15b are connected to the control system 13 via data lines, which are not illustrated in the figures in order not to adversely affect the clarity of the figures. Control data, such as, for example, data that vary the optical system of a projector 7a-7e, 9a-9e, 11a, 11b, and payload data, such as, for example, the image data or recordings from the cameras 15a, 15b that are provided for the projection, can be transmitted via the data lines.

The projectors 7a-7e form a first group 17a of vertical projectors 7a-7e, i.e., these are projectors arranged substantially perpendicular to the planar projection surface 5. The projectors 9a-9e form a second group 17b of vertical projectors 9a-9e, which are likewise arranged substantially perpendicular to the planar projection surface 5. The vertical projectors 7a-7e, 9a-9e are oriented such that a person or an object situated directly underneath the respective projector 7a-7e, 9a-9e does not cast a shadow.

The first and second groups 17a, 17b of vertical projectors 7a-7e, 9a-9e are arranged respectively along a first and second projector axis 19a, 19b, wherein the projector axes 19a, 19b in the exemplary embodiment run parallel to the planar projection surface 5. In the exemplary embodiment, the vertical projectors 7a-7e, 9a-9e are arranged along a projector axis 19a, 19b in as much as a central image axis (not illustrated) of each projector 7a-7e, 9a-9e intersects the respective projector axis 19a, 19b and the image axes extend in each case perpendicular to the planar projection surface 5. In the exemplary embodiment, all the vertical projectors 7a-7e, 9a-9e are arranged at the same distance from the planar projection surface 5. Along the respective projector axis 19a, 19b, the vertical projectors 7a-7e, 9a-9e are spaced apart uniformly from one another, i.e., the distance between two adjacent vertical projectors along the projector axis 19a, 19b is constant along the projector axis 19a, 19b.

FIG. 1 shows a simple, schematic layout 3 of a passenger cabin of an aircraft. The layout 3 illustrated merely comprises three seating regions 23a, 23b, 23c for rows of seats (not shown in FIG. 1), which are bounded laterally by the outer walls 25a, 25b of the cabin. A first and a second aisle region 27a, 27b are arranged between the seating regions 23a, 23b, 23c, the aisle regions extending respectively along a first and a second aisle axis 29a, 29b.

In all the figures, the layout is represented by dark lines on a bright background. For this purpose, the contours of the cabin layout can be projected in dark colors onto a white or bright projection surface 5, a commercially available floor covering suitable for this purpose, e.g., a carpet. In the present exemplary embodiment, however, a dark, less vulnerable carpet was used as projection surface 5, onto which carpet the cabin layout was projected as a negative, i.e., the bright regions of the layout 3 were illuminated, while the contours represented as dark lines were not illuminated.

The layout 3 of the passenger cabin as shown in FIG. 1 has been calculated from specification data by the control system 13, which specification data, loaded into the control system 13 by an operator. The control system 13 processes the specification data and calculates from them image data which are suitable for the representation by means of the projectors 7a-7e, 9a-9e, 11a, 11b and which are represented on the projection surface 5 on the original scale during a projection by the projectors 7a-7e, 9a-9e, 11a, 11b. In other words, the dimensions of the layout 3 projected onto the projection surface 5 in FIG. 1 correspond to the dimensions of the aircraft cabin that is actually constructed. An observer, upon traversing the projection surface 5, can thus obtain a realistic impression of the size relationships. Moreover, it is possible, for example, to check whether the aisle sections 27a, 27b are dimensioned sufficiently to allow movement with trollies for attending to the passengers or else with wheelchairs through the aisle sections 27a, 27b. If sections of the passenger cabin other than those illustrated in FIG. 1 or further details such as, for example, the contours of individual seats are also projected, the observer can already obtain an impression of the seat spacings or, for example, the space conditions in the washrooms, without this necessitating constructing a model on the original scale.

The image data calculated by the control system 13 are distributed by the control system 13 to the projectors 7a-7e, 9a-9e, 11a, 11b for representation or projection. In this case, the control system 13 can additionally control the projectors 7a-7e, 9a-9e, 11a, 11b, for example by varying the brightness of the projectors 7a-7e, 9a-9e, 11a, 11b or the optical system thereof in order to ensure a projection which is true to scale and not distorted. In this case, the control system can also vary the brightness of the images of individual regions of the projection in order to compensate for possible overlaps between projections by two or more projectors. This is explained in greater detail below with reference to FIG. 3.

Figure 3:
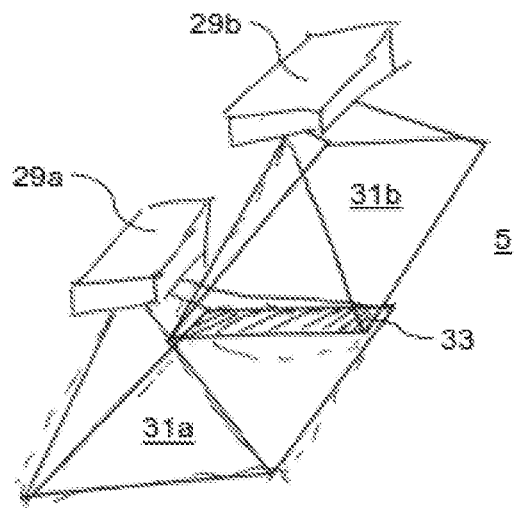
FIG. 3 shows an arrangement of two vertical projectors of one exemplary embodiment of a system.

FIG. 3 illustrates, by way of example, two adjacent vertical projectors 29a, 29b, the projections of which overlap. By way of example, they can be two vertical projectors 7a-7e of the first group 17a or two vertical projectors 9a-9e of the second group 17b. However, it is also conceivable for the vertical projectors to be one vertical projector 7a-7e of the first group 17a and one vertical projector 9a-9e of the second group 17b. Each of the two vertical projectors 19a, 19b illuminates a rectangular projection region 31a, 31b of the projection surface 5. The two projection regions 31a, 31b overlap in an overlap region 33 (illustrated in a hatched manner). On the overlap region 33 of the projection surface 5, the cabin layout 3 (not shown in FIG. 3 in order to ensure the discernibility of the figure) can thus be represented only by one of the two vertical projectors 29a, 29b at a time or by both vertical projectors 29a, 29b at the same time.

In the exemplary embodiment illustrated in FIG. 3, the cabin layout 3 is projected in the overlap region 33 by both vertical projectors 29a, 29b with identical brightness and simultaneously in FIG. 3. The control system 13 drives the vertical projectors 29a, 29b such that a body situated in the overlap region 33, such as, for example, a person walking along an aisle section, casts the smallest possible shadow. The driving of the vertical projectors 29a, 29b thus results in the least possible shadow casting and hence projection with few shadows while simultaneously ensuring accessibility. This has the advantage that the shadow casting by persons or objects arranged in the overlap region is kept as small as possible since the shadow casting produced by one projector 29a, 29b is minimized by the illumination by the other projector 29a, 29b. In order that the projected cabin layout 3 is uniformly bright, the brightness of the projection in the overlap region 33 is adapted by the control system 13 such that the total brightness of the projected cabin layout 3 in the overlap region 33, i.e., the brightness of the layout superimposed by both projectors 29a, 29b, corresponds to the brightness of the projection in the sections of the respective projection regions 31a, 31b which are illuminated only by one of the projectors 29a, 29b.

FIG. 3 shows, by way of example, only the overlap of the projection regions 31a, 31b from two projectors 29a, 29b. It goes without saying that the projections from more than two projectors can also overlap in an overlap region or a projection region 31a, 31b can also comprise more than one overlap region. The control system 13 must correspondingly take account of these overlaps, it generally being preferred if, in an overlap region, each of the projectors illuminating the region projects the layout in order to achieve projection with the fewest possible shadows.

In the exemplary embodiment illustrated in FIG. 1 it can be discerned that the projector axes 19a, 19b are arranged such that, during a projection of the cabin layout 3 on the original scale, they run parallel to the aisle axes 34a, 34b and, relative to the planar projection surface 5, perpendicularly above the aisle axes 34a, 34b. In other words, the first and second projector axes 19a, 19b and the first and second aisle axes 34a, 34b respectively situated underneath run in a first and a second aisle plane, respectively, wherein the aisle plane extends perpendicular to the planar projection surface 5. The aisle planes are not illustrated in the figures. The arrangement of the vertical projectors 7a-7e, 9a-9e perpendicular above the aisle sections or regions 27a, 27b, which follows from the arrangement of the projector and aisle axes 19a, 19b, 34a, 34b, has the effect that persons who move or objects which are moved along the aisle sections are illuminated as far as possible perpendicularly from above. As a result, the shadow casting by the persons or objects is kept as small as possible and projection free of shadows or at least with few shadows is achieved, even if persons move on the projection surface. Since persons generally move along the aisle section 27a, 27b, projection with few shadows is advantageously possible, without this necessitating an active identification of the position of the persons.

It also follows from the text above, however, that the arrangement of the vertical projectors 7a-7e, 9a-9e is not suitable for arbitrary cabin layouts. Rather, projection with few shadows is achieved only if the arrangement of the vertical projectors 7a-7e, 9a-9e is coordinated with the cabin layout to be represented and, in particular, with the course of the aisle sections 27a, 27b. Even if the cabin layout data are not loaded permanently into the control system 13 and are exchangeable, in particular, the cabin layout nevertheless dictates the arrangement of the vertical projectors 7a-7e, 9a-9e.

The two cameras 15a, 15b of the system are advantageously used to capture the projection surface 5 and to correct or to improve the representation of the layout 3. The image data captured by the two cameras 15a, 15b in the exemplary embodiment (more or fewer cameras are conceivable) are transmitted to the control system 13 and compared there with the loaded cabin layout data. On the basis of the comparison, the control system can determine deviations between the actually projected cabin layout 3 and the envisaged representation. By way of example, it is possible to identify regions having differing brightness or regions in which the representation is not continuous in the transition between two projection regions 31a, 31b. Given a known orientation and optical system of the cameras 15a, 15b, it is also possible to check whether the layout 3 is represented on the original scale and without distortions.

If the control system 13 determines deviations between the planned and the actual representation of the layout 3, it corrects the representation, for example by adapting the processing of the cabin layout data or by altering the control of the projectors 7a-7e, 9a-9e, 11a, 11b. The altered representation can be checked by means of further camera recordings and can be improved by means of further corrections possibly required. The alteration of the processing of the cabin layout data or else the adaptation of the control of the projectors 7a-7e, 9a-9e, 11a, 11b can be carried out automatically by the control system 13 or else by an operator who visually compares the planned representation with the recordings from the cameras 15a, 15b.

Figure 2:
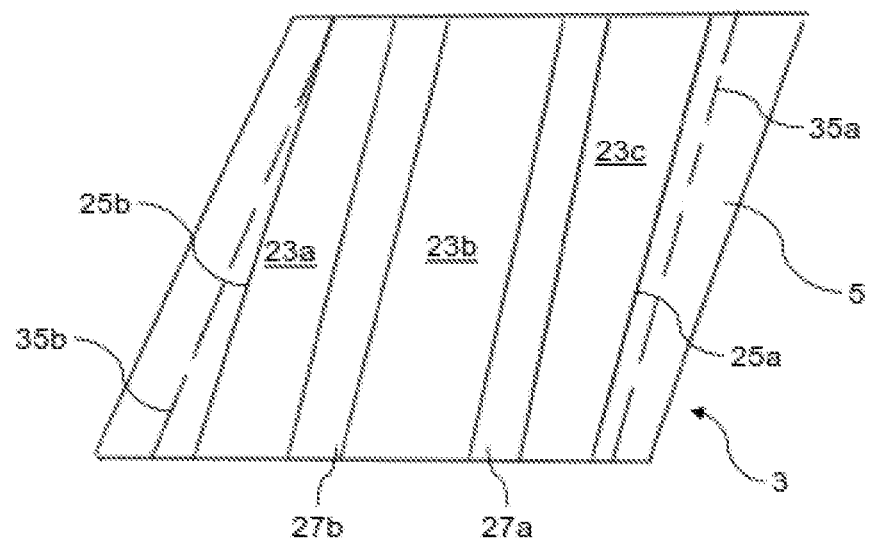
FIG. 2 shows a projection surface of a further exemplary embodiment of a system, onto which projection surface a layout of a vehicle cabin and a cabin boundary have been projected.

Alternatively or supplementarily, it is possible, as shown in FIG. 2, for the purpose of checking the true-to-scale representation and correct orientation of the projection, to use additional cabin boundaries 35a, 35b, which are projected onto the projection surface 5 by the projectors 7a-7e, 9a-9e, 11a, 11b independently of the projection of a cabin layout 3. From among the components of the system 1, FIG. 2 shows only the projection surface 5.

The cabin boundaries 35a, 35b are stored in the control system 13 independently of the cabin layout data and are projected onto the projection surface indeed simultaneously with the layout 3, but nevertheless independently thereof. The true-to-scale representation of the cabin boundaries 35a, 35b can therefore be uniquely verified independently of the layouts 3 projected in each case, for example by actually measuring subsequently whether the dimensions of the projected cabin boundary 35a, 35b correspond to the real dimensions of the cabins. Since the outer cabin boundary 35a, 35b is always the same independently of the cabin layout 3, by comparing the projected cabin boundary 35a, 35b and the projection of the outer walls 25a, 25b it is possible to determine whether the representation on the projection surface is true to scale, correctly oriented and free of distortion in the edge regions. The comparison between the cabin boundary 35a, 35b and the outer walls 25a, 25b and a possibly required correction of the projection by alteration of the projection or of the processing of the cabin layout data can be carried out by the control system 13 in an automated manner by means of the cameras 15a, 15b, for example. However, the cabin boundaries 35a, 35b also actually enable a simple correction by an operator since corrections can easily be derived from the purely visual comparison.

The system 1 shown in FIG. 1 and described hitherto with reference to FIGS. 1 to 3 additionally comprises a manipulation unit 37, which is part of the control system 13. By means of the manipulation unit 37, a user or operator of the system 1 can make changes to the representation of a cabin layout 3 during the representation of the cabin layout 3. By way of example, the operator could reduce the width of the aisle sections 27a, 27b, such that wider seats can be arranged in the seating regions 23a, 23b, 23c. This change made by means of the manipulation unit 37, for example a tablet or a computer, is immediately represented by the system 1 and, if desired, can be translated directly into specification data that are used later for producing the cabin. In this way, the design and engineering process for the cabin can be significantly shortened since laborious feedback in respect of the representation to the engineering departments is obviated.

Figure 4:
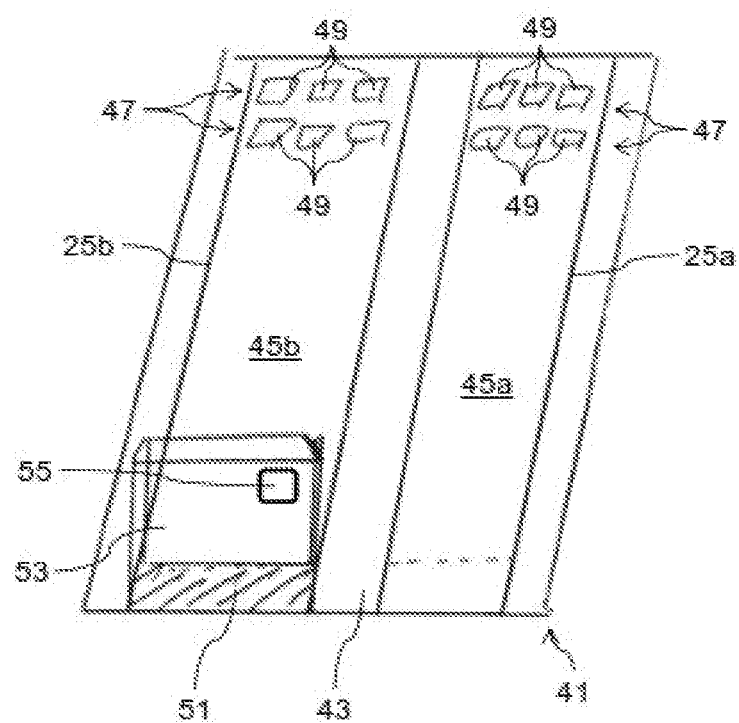
FIG. 4 shows a planar projection surface of a further exemplary embodiment of a system, onto which projection surface a layout of a vehicle cabin is projected.

Finally, FIG. 4 shows an alternative layout 41 of a vehicle cabin having only a single aisle region 43 between two seating regions 45a, 45b. By way of example, the layout shown is the passenger cabin of a single-aisle aircraft having only one aisle. In addition, FIG. 4 schematically shows in each case two rows of seats 47. In order to give an observer a more realistic appreciation of the dimensions of the seats, volume elements 49 have been arranged on the contours of the seats 47. In addition, a further volume element 53 has been arranged in a further region of the cabin, in which a washroom has been represented by a hatched area 51, the further volume element conveying the dimensions of the washroom to an observer.

Illustration of the other components of the system 1, such as projectors 7a-7e, 11a, 11b and control system 13, has been dispensed with in FIG. 4. For the sake of completeness, however, it is pointed out that the system 1 from FIG. 4 has only a first group 17a of vertical projectors 7a-7e since the cabin layout 41 in FIG. 4 also has only one aisle region 43. For the rest, however, the system from FIG. 4 corresponds to the system in FIG. 1.

In the exemplary embodiment in FIG. 4, the two additional projectors 11a, 11b, which are horizontal projectors 11a, 11b, the central image axes of which is inclined with respect to the central image axes of the vertical projectors 7a-7e, 9a-9e, are used to project sections of the cabin layout 41 onto the volume elements 49, 53. FIG. 4 shows by way of example a luminous symbol 55 that has been projected onto the volume element 53 and indicates whether the washroom is occupied.

Finally, it should be pointed out that, by way of example, the floor or other areas of a vehicle cabin can also be used as projection surface and the projection of the layout can be used to indicate where and which elements are intended to be positioned during production of the cabin.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A system for representing a layout of a vehicle cabin on an original scale, wherein the system comprises:
    a plurality of projectors,
    a planar projection surface, and
    a control system,
    wherein the layout to be represented is configured to be loaded as digital cabin layout data into the control system and the layout to be represented comprises at least one first aisle section which corresponds to a passage area for persons in the vehicle cabin and which extends along a first aisle axis,
    wherein the plurality of projectors comprises at least one first group of vertical projectors which are arranged at a distance from one another along a first projector axis, and
    wherein the control system is configured to drive the plurality of projectors and to process cabin layout data loaded into the control system such that
        the layout of the vehicle cabin is projected on the planar projection surface on the original scale, and
        at least one section of the layout of the vehicle cabin is projected onto the planar projection surface by the first groups of vertical projectors, wherein that section of the layout which is projected by the first group of vertical projectors comprises the first aisle section and the first aisle section is projected such that the first aisle axis runs with the first projector axis in a first aisle plane, wherein the first aisle plane extends perpendicular to the planar projection surface, wherein a distance between at least two vertical projectors is such that regions of the planar projection surface which are illuminated by projectors arranged adjacent to one another overlap in sections in one or a plurality of overlap regions, such that in the one or the plurality of overlap regions the layout of the vehicle cabin is projected onto the planar projection surface simultaneously by two or more projectors, wherein the control system is configured to drive the vertical projectors such that a body situated in the overlap region casts at most a reduced shadow.

2. The system according to claim 1, wherein the layout to be represented comprises a second aisle section, which corresponds to a second passage area for persons in the vehicle cabin and which extends along a second aisle axis, wherein the plurality of projectors comprises a second group of vertical projectors which are arranged at a distance from one another along a second projector axis, and wherein the control system is configured to drive the plurality of projectors and to process the cabin layout data loaded into the control system such that at least one section of the layout of the vehicle cabin is projected onto the planar projection surface by the second groups of vertical projectors, wherein that section of the layout which is projected by the second group of vertical projectors comprises the second aisle section and the second aisle section is projected such that the second aisle axis runs with the second projector axis in a second aisle plane, wherein the second aisle plane extends perpendicular to the planar projection surface.

3. The system according to claim 1, wherein the control system is configured to drive the vertical projectors such that a brightness of the layout of the vehicle cabin that is projected onto the planar projection surface in the one or the plurality of overlap regions corresponds to a brightness of the layout of the vehicle cabin that is projected onto the planar projection surface in regions in which the layout of the vehicle cabin is projected onto the planar projection surface only by one projector.

4. The system according to claim 1, wherein the control system is configured to drive the vertical projectors such that independently of the projection of the layout of the vehicle cabin, a cabin boundary is projected onto the planar projection surface on the original scale, wherein the cabin boundary is generated by the control system not from cabin layout data loaded into the control system, wherein the cabin boundary is projected onto the planar projection surface simultaneously with the projection of the layout of the vehicle cabin, and wherein from a superimposition of the projected cabin boundary and the projected layout of the vehicle cabin it is possible to ascertain whether the layout is projected onto the planar projection surface on the original scale.

5. The system according to claim 1, wherein the system comprises a plurality of volume elements which have been arranged on the planar projection surface based on the projected layout of the vehicle cabin.

6. The system according to claim 1, wherein the system comprises at least one camera which is connected to the control system and which is configured to capture, at least in sections, the planar projection surface with the layout of the vehicle cabin projected thereon, wherein the control system is configured to determine deviations between the layout of the vehicle cabin that is projected onto the planar projection surface and is captured by the camera and cabin layout data loaded into the control system and, based on the deviations determined previously, to at least one of alter driving of the plurality of projectors or processing of the cabin layout data loaded into the control system such that deviations between the layout of the vehicle cabin that is projected onto the planar projection surface and is captured by the camera and the cabin layout data loaded into the control system are minimized.

7. The system according to claim 4, wherein the system comprises at least one camera which is connected to the control system and which is configured to capture, at least in sections, the planar projection surface with the layout of the vehicle cabin projected thereon and the cabin boundary projected thereon, and wherein the control system is configured to determine deviations between the layout of the vehicle cabin that is projected onto the planar projection surface and is captured by the camera and the cabin boundary that is projected onto the planar projection surface and is captured by the camera and, based on the deviations determined previously, to at least one of alter driving of the plurality of projectors or processing of the cabin layout data loaded into the control system such that deviations between the layout of the vehicle cabin that is projected onto the planar projection surface and is captured by the camera and the cabin boundary that is projected onto the planar projection surface and is captured by the camera are minimized.

8. The system according to claim 1, wherein the planar projection surface is formed by a commercially available covering on which observers of the layout of the vehicle cabin that is projected onto the planar projection surface can pass.

9. The system according to claim 1, wherein the control system is configured to project two different layouts of vehicle cabins simultaneously onto the projection surface, wherein the control system is furthermore configured to at least one of project the different layouts of vehicle cabins onto the planar projection surface in different colors or project the different layouts of vehicle cabins onto the planar projection surface with different, adjustable brightnesses.

10. The system according to claim 1, wherein the cabin layout data are specification data used for producing the vehicle cabin, and wherein the control system is configured to process the specification data in order to generate a representation of the layout of the vehicle cabin that is projected onto the planar projection surface.

11. The system according to claim 1, wherein the control system comprises a manipulation unit, via which a user can alter a representation of the layout of the vehicle cabin that is projected onto the planar projection surface at the same time, wherein the control system is configured to drive the plurality of projectors such that the altered representation is projected onto the planar projection surface.

12. The system according to claim 10,
wherein the control system comprises a manipulation unit, via which a user can alter a representation of the layout of the vehicle cabin that is projected onto the planar projection surface at the same time,
wherein the control system is configured to drive the plurality of projectors such that the altered representation is projected onto the planar projection surface,
wherein the control system is configured to translate the representation of the layout of the vehicle cabin that has been altered by means of the manipulation unit into altered specification data, wherein the altered specification data can be used for producing a vehicle cabin.

13. The system according to claim 1,
wherein the plurality of projectors comprises at least one horizontal projector which is provided for projecting sections of the layout of the vehicle cabin which are projected onto at least one inclined projection surface arranged in a manner not parallel to the planar projection surface,
wherein the control system is configured to drive the at least one horizontal projector and to process the cabin layout data loaded into the control system such that the layout of the vehicle cabin is represented on a at least one inclined projection surface on the original scale.

14. The system according to claim 13, wherein the at least one horizontal projector is arranged in a manner inclined with respect to the vertical projectors.

15. A method for representing a layout of a vehicle cabin on an original scale on a planar projection surface with a plurality of projectors, comprising the steps:
loading the layout to be represented into a control system as digital cabin layout data and the layout to be represented comprises at least one first aisle section which corresponds to a passage area for persons in the vehicle cabin and which extends along a first aisle axis,
arranging the plurality of projectors, which comprises at least one first group of vertical projectors, at a distance from one another along a first projector axis, and
driving the plurality of projectors by the control system, and
processing the cabin layout data loaded into the control system such that:
the layout of the vehicle cabin is projected on the planar projection surface on the original scale, and
at least one section of the layout of the vehicle cabin is projected onto the planar projection surface by the first groups of vertical projectors,
wherein that section of the layout which is projected by the first group of vertical projectors comprises the first aisle section, and the first aisle section is projected such that the first aisle axis runs with the first projector axis in a first aisle plane, wherein the first aisle plane extends perpendicular to the planar projection surface,
wherein the distance between at least two vertical projectors is chosen such that regions of the planar projection surface which are illuminated by projectors arranged adjacent to one another overlap in sections in one or a plurality of overlap regions, such that in the one or the plurality of overlap regions the layout of the vehicle cabin is projected onto the planar projection surface simultaneously by two or more projectors,
wherein the control system drives the vertical projectors such that a body situated in the overlap region casts at most a reduced shadow.

16. The method according to claim 15,
wherein the layout to be represented comprises a second aisle section, which corresponds to a second passage area for persons in the vehicle cabin and which extends along the second aisle axis,
wherein the plurality of projectors comprises a second group of vertical projectors which are arranged at a distance from one another along a second projector axis,
wherein the plurality of projectors is driven by the control system and the cabin layout data loaded into the control system are processed such that at least one section of the layout of the vehicle cabin is projected onto the planar projection surface by the second groups of vertical projectors,
wherein that section of the layout which is projected by the second group of vertical projectors comprises the second aisle section and the second aisle section is projected such that a second aisle axis runs with the second projector axis in a second aisle plane, and
wherein the second aisle plane extends perpendicular to the planar projection surface.

17. The method according to claim 15, wherein the control system drives the vertical projectors such that a brightness of the layout of the vehicle cabin that is projected onto the projection surface in the one or the plurality of overlap regions corresponds to a brightness of the layout of the vehicle cabin that is projected onto the projection surface in regions in which the layout of the vehicle cabin is projected onto the planar projection surface only by one projector.

18. The method according to claim 15,
wherein the control system drives the vertical projectors such that independently of the projection of the layout of the vehicle cabin, a cabin boundary is projected onto the planar projection surface on the original scale,
wherein the cabin boundary is generated by the control system not from the cabin layout data loaded into the control system,
wherein the cabin boundary is projected onto the planar projection surface at the same time as the layout of the vehicle cabin, and
wherein from a superimposition of the projected cabin boundary and the projected layout of the vehicle cabin it is possible to ascertain whether the layout is projected onto the planar projection surface on the original scale.

19. The method according to claim 15, wherein a plurality of volume elements are arranged on the planar projection surface based on the projected layout of the vehicle cabin.

20. The method according to claim 15,
wherein a camera connected to the control system captures, at least in sections, the planar projection surface with the layout of the vehicle cabin projected thereon, and
wherein the control system determines deviations between the layout of the vehicle cabin that is projected onto the planar projection surface and is captured by the camera and the cabin layout data loaded into the control system and, based on the deviations determined previously, alters at least one of driving of the plurality of projectors, or processing of the cabin layout data loaded into the control system, such that deviations between the layout of the vehicle cabin that is projected onto the planar projection surface and is captured by the camera and the cabin layout data loaded into the control system are minimized.

21. The method according to claim 18,
wherein the camera connected to the control system captures, at least in sections, the planar projection surface with the layout of the vehicle cabin projected thereon and the cabin boundary projected thereon, and
wherein the control system determines deviations between the layout of the vehicle cabin that is projected onto the planar projection surface and is captured by the camera and the cabin boundary that is projected onto the planar projection surface and is captured by the camera and, on the basis of determined deviations, alters at least one of driving of the plurality of projectors, or processing of the cabin layout data loaded into the control system, such that deviations between the layout of the vehicle cabin that is projected onto the planar projection surface and is captured by the camera and the cabin boundary that is projected onto the planar projection surface and is captured by the camera are minimized.

22. The method according to claim 15,
wherein the control system is configured to project two different layouts of vehicle cabins simultaneously onto the projection surface,
wherein the control system is configured to at least one of project the different layouts of vehicle cabins onto the planar projection surface in different colors, or project the different layouts of vehicle cabins onto the planar projection surface with different, adjustable brightnesses.

23. The method according to claim 15, wherein the cabin layout data loaded into the control system are specification data used for producing the vehicle cabin, and wherein the control system processes the specification data in order to generate a representation of the layout of the vehicle cabin that is projected onto the planar projection surface.

24. The method according to claim 15, wherein, by means of a manipulation unit, a user can alter a representation of a layout of the vehicle cabin that is projected onto the planar projection surface at the same time, and the control system drives the plurality of projectors such that the altered representation is projected onto the planar projection surface.

25. The method according to claim 23,
wherein, by means of a manipulation unit, a user can alter a representation of a layout of the vehicle cabin that is projected onto the planar projection surface at the same time, and the control system drives the plurality of projectors such that the altered representation is projected onto the planar projection surface,
wherein the control system translates the representation of the layout that has been altered by means of the manipulation unit into altered specification data, wherein the altered specification data can be used for producing a vehicle cabin.

26. The method according to claim 15,
wherein the plurality of projectors comprises at least one horizontal projector which is provided for projecting sections of the layout of the vehicle cabin which are projected onto at least one inclined projection surface arranged in a manner not parallel to the planar projection surface,
wherein the control system drives the at least one horizontal projector and processes the cabin layout data loaded into the control system such that the layout of the vehicle cabin is represented on the at least one inclined projection surface on the original scale.

* * * * *